United States Patent
DuFour (12)

(10) Patent No.: US 6,229,864 B1
(45) Date of Patent: May 8, 2001

(54) PHASE LOCKED LOOP LOCK CONDITION DETECTOR

(75) Inventor: Yves DuFour, Sunnyvale, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 08/993,129

(22) Filed: Dec. 18, 1997

(51) Int. Cl.$^7$ ........................................................ H03D 3/24
(52) U.S. Cl. ............................................. 375/375; 327/156
(58) Field of Search .................................... 375/375, 373, 375/376, 371, 215; 327/147, 156

(56) References Cited

U.S. PATENT DOCUMENTS

| | | | |
|---|---|---|---|
| 3,878,334 | * | 4/1975 | Halpern . |
| 4,069,462 | * | 1/1978 | Dunn . |
| 4,264,866 | | 4/1981 | Benes ................................... 328/134 |
| 4,277,754 | | 7/1981 | Minakuchi ........................... 328/133 |
| 4,587,496 | * | 5/1986 | Wolaver ................................... 331/1 |
| 4,803,705 | * | 2/1989 | Gillingham et al. . |
| 4,916,405 | * | 4/1990 | Dunn . |
| 5,610,954 | * | 3/1997 | Miyashita et al. ................... 375/375 |
| 5,724,007 | * | 3/1998 | Mar ......................................... 331/25 |
| 5,757,857 | * | 5/1998 | Buchwald ............................ 375/271 |
| 5,764,714 | * | 6/1998 | Stansell et al. ....................... 375/377 |
| 5,822,387 | * | 10/1998 | Mar ....................................... 375/376 |
| 5,886,582 | * | 3/1999 | Stansell ............................... 331/1 A |

FOREIGN PATENT DOCUMENTS 08191247A   7/1996   (JP) .............................. H03L/7/113

* cited by examiner

Primary Examiner—Chi Pham
Assistant Examiner—Jean B Corrielus
(74) Attorney, Agent, or Firm—Brian J. Wieghaus

(57) ABSTRACT

A lock condition detector for determining whether two signals are within a specified lock condition includes a phase detector which determines whether the first and second signals are within a prescribed phase condition and a frequency detector which determines whether the two signals are within a prescribed frequency relationship. An analyzer outputs a lock condition signal indicative of the first and second signals being out of lock whenever the phase condition signal indicates that the two signals are outside of the phase condition and whenever the frequency condition signal indicates that the two signals are outside of the prescribed frequency condition. The combination of the phase detector and the frequency detector prevents an erroneous in-lock condition signal when the two signals are in phase but at multiple frequencies of each other, as well as eliminates a high frequency data stream when there is a large frequency error between the two signals which would occur if only a phase detector were used.

18 Claims, 2 Drawing Sheets

PHASE LOCKED LOOP LOCK CONDITION DETECTOR

BACKGROUND OF THE INVENTION

1. Field of the Invention

The invention relates generally to detection circuits which determine whether two input signals have the same frequency and phase. More particularly, the invention relates to a lock condition detector for use with a phase locked loop (PLL) circuit, and to the combination of the two circuits. The invention also relates to a method of detecting a lock condition between two signals.

2. Description of the Prior Art

PLL circuits are used in a variety of applications including microprocessors, digital video systems, and mobile communication devices, such as cell phones. A PLL circuit is used where a clock signal needs to be generated and synchronized to another source, such as an external reference signal. In its most basic form, as illustrated in FIG. 1, a PLL circuit includes a voltage controlled oscillator "VCO" 10, which is an oscillator that can run over a range of frequencies dependant on a control voltage applied to a control terminal of the VCO. The VCO is driven by a phase error between the output of the VCO and the reference signal, measured by a loop phase comparator 20. This error is used to change the control voltage in such a way that the error between the reference signal and the output of the VCO is reduced, with the goal of maintaining the output of the VCO the same as the reference signal with respect to phase and frequency. Typically, the PLL includes a filter 30 in the control voltage path to provide stability to the control loop. Additionally, by inserting a loop divider 40 between the phase comparator and the VCO, the output of the VCO can be made to be a multiple of the reference signal. The above illustrates the most basic form of a PLL. Examples of some advanced designs of PLL circuits are shown, for example, in U.S. Pat. Nos. 5,349,613; 5,475,718; 5,349,613 and EP 0 433 120 A1.

Despite advances in control mechanisms, it is still possible in many applications for the output signal of the VCO to become out of lock with respect to the reference signal. Out of lock means that the output signal of the VCO differs from the reference signal with respect to phase and/or frequency by a predetermined factor relevant to the application that the PLL is being used for. This may occur, for example, because a component becomes damaged or the desired output frequency is not achievable by the VCO, for example due to a change in the ambient temperature of the circuit or supply voltage. In certain applications, it is desirable that the device, in which the PLL is used, either perform a certain function or not perform a certain function. For example, in a cell phone, transmitting at a non-desired frequency will interfere with other communications and should be avoided. An out of lock condition signal could then be used to avoid transmission.

Accordingly, it is an object of the invention to provide a lock detection circuit which indicates when two signals are out of lock.

It is another object of the invention to provide such a circuit which generates a signal when the out of lock condition is detected to control the operation of device containing the PLL.

SUMMARY OF THE INVENTION

Generally speaking, according to the invention, a lock condition detector includes a phase detector which receives first and second signals and outputs a phase condition signal indicative of the first and second signals being within or outside of a prescribed phase difference. A frequency detector outputs a frequency condition signal indicative of the first and second signals being within or outside of a prescribed frequency difference. An analyzer receives the phase condition signal and the frequency condition signal and generates an out of lock condition signal indicative of the first and second signals being out of lock whenever the phase condition signal indicates that the first and second signals are outside of the phase condition and whenever the frequency condition signal indicates that the first and second signals are outside of the prescribed frequency condition.

The invention is based on the recognition that to determine whether two signals are in lock, it is not sufficient to only detect whether the two signals are in phase. The two signals could be seen as being in phase when the two signals are at frequencies which are multiples of each other. The combination of a frequency detector with a phase detector thus ensures that an out of lock condition signal is generated whenever the two signals are outside of selected frequency relationship, despite the phase detector indicating an in-phase relationship. Additionally, if only a phase detector were used, the output would be a high frequency signal equal to the frequency error between the two signals. For many practical devices, such as with a PLL in a cell phone, such a high frequency signal could not be reliably detected by a microprocessor in the device. The frequency detector thus ensures that a stable, constant out of lock signal is generated whenever the frequency error is greater than a selected value.

According to one aspect of the invention, the phase detector is a D type-flip flop clocked by the reference signal, which outputs the logic value of the oscillator signal.

According to another aspect of the invention, the frequency detector includes first and second dividers dividing each of the first and second signals by a selected divisor. Each divider outputs an end of count signal, which are fed to a second D-type flip flop. The second D-type flip flop then outputs a logic signal indicative of whether the first and second signals are within or outside of frequency difference equal to the quotient of the reference signal and the divisor.

According to another aspect of the invention, the analyzer implements a combinatorial logic function on the phase condition signal and the frequency condition signal to generate the lock condition signal. In the disclosed implementation, the logic function is simply the AND function.

Another aspect of the invention concerns the combination of a PLL with a lock condition detector. The invention also concerns a method of determining whether two signals are within a specified lock condition.

These and other object, features and advantages of the invention will become apparent with reference to the following detailed description and the drawings.

DESCRIPTION OF THE PREFERRED EMBODIMENTS

Figure 1:
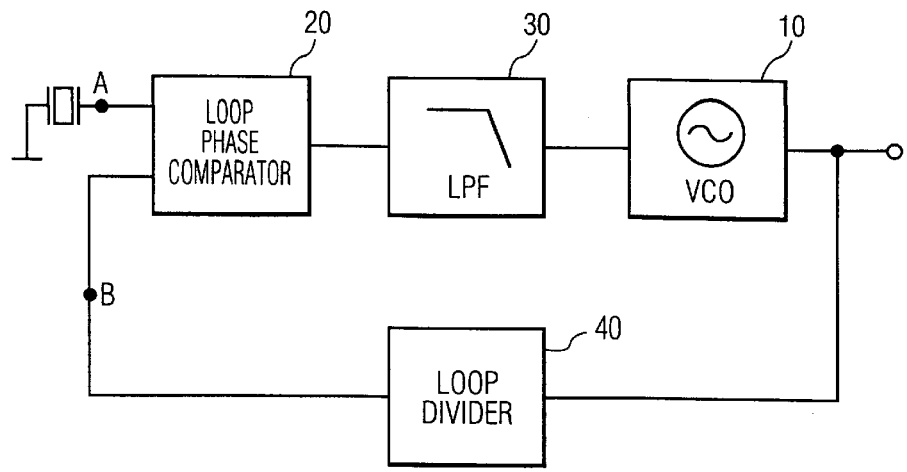
FIG. 1 is a schematic of a PLL circuit in its most basic form (prior art)
Figure 2:
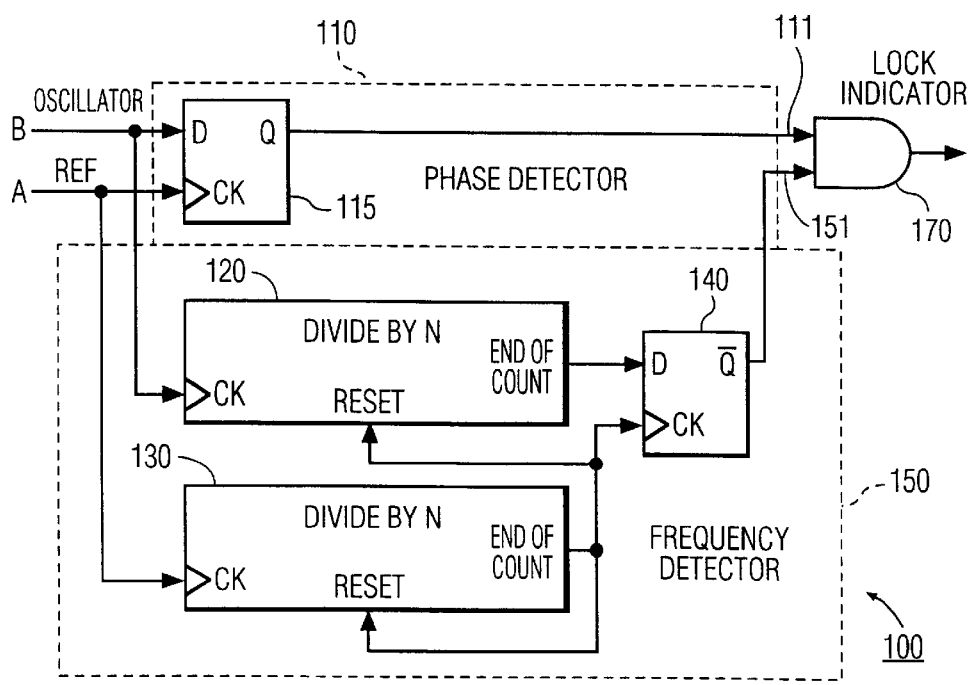
FIG. 2 is a schematic of the in-lock condition detector circuit according to the invention.

FIG. 2 illustrates the lock condition detector 100 according to the invention, which determines whether two signals are within a desired lock condition. In the application shown, the lock condition detector, in combination with a PLL as in FIG. 1, determines whether the oscillator signal from the VCO is locked with the reference signal. The detector 100 includes a phase detector 110 and a frequency detector 150, each having an output 111, 151 supplied to respective inputs of an analyzer 170, in this case an AND gate.

Figure 3:
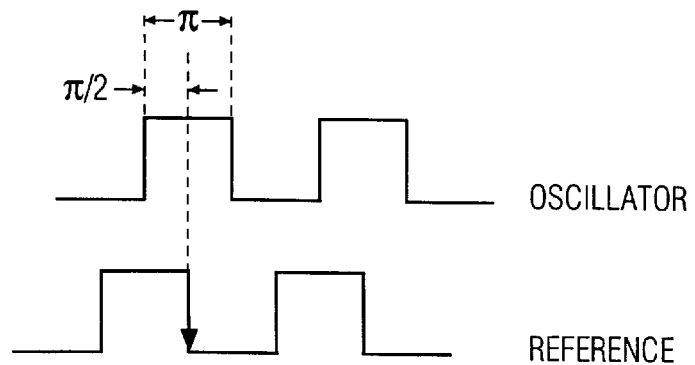
FIG. 3 is a timing diagram illustrating the in-lock condition between the oscillator and reference signals for a PLL in which the comparator is a Gilbert cell mixer.

The phase detector 110 receives the reference signal and the oscillator signal and outputs a logic signal representative of whether the reference signal and the oscillator signal are within a prescribed phase relationship. In one application of the lock condition detector, the loop phase comparator 20 of the PLL is a Gilbert cell mixer. Such mixers are well known in the art. With a Gilbert cell mixer, the oscillator and reference signals are square wave and are defined to be in-lock with a phase difference of plus or minus (+/−) $\pi/2$, as illustrated in FIG. 3. In other words, the falling edge of the reference signal normally occurs at the mid-point of the logic high portion of the oscillator waveform. The sign of the phase difference is dependent on the sign of the VCO gain.

In a suitable embodiment for this type of comparator, the phase detector 110 is a D-type flip flop 115 ("DFF") in which the clock input ("CK") receives the reference signal and the data input ("D") receives the oscillator signal. The DFF 115 is falling edge triggered, which means that it transfers data at its input D to the Q output whenever the reference signal at its CK input changes from logic high to logic low. Thus, on the occurrence of each falling edge of the reference signal, the DFF 115 outputs a logic value of the oscillator signal present at its input. Since the oscillator signal is square wave, it is logic high for ½ of the total cycle. This means that when the reference signal transitions from high to low, the DFF 115 will output a logic high signal if the oscillator signal is logic high and a logic low signal if the oscillator signal is low. However, the oscillator signal can be logic high for a period of Pi at the instant the DFF is triggered by the rising edge of the reference signal, so the phase detection is accurate only to a phase error of $\pi$, i.e $\pi/2$ in each of the positive and negative directions.

Thus, when the oscillator signal is in phase with the reference signal within a phase error of $\pi/2$ in either direction from the nominal in-lock phase difference, the phase detector will output a logic high signal and if out of phase by more than $\pi/2$ in either direction, will output a logic low. However, the frequency of the oscillator signal can be off by a factor of two (or other multiple) from the reference signal and still be seen as being in phase by the DFF 115. In other words, when the DFF is edge triggered by the reference signal over a large plurality of cycles, the oscillator signal can be logic high and the DFF will output a logic high over the large plurality of cycles, despite a frequency difference of a factor of two (or other multiple) between the two signals. Accordingly, in applications where it is critical to have the oscillator signal in lock with the reference signal with respect to frequency, such as in cell phone applications, measuring phase alone is not sufficient.

Additionally, when there is a large frequency error, the bit stream output of the phase detector will be at a frequency of $f_{osc}-f_{ref}$, and can be on the order of tens to hundreds of MHZ. Even with the frequencies off by a small percentage, the output of the phase detector can be on the order of MHZ.

Since the output of the lock condition detector is used to control the functioning of a device, it would typically be input to a micro controller programmed to take an action when the lock condition detector indicated that the VCO is out of lock. Such a high frequency output cannot be easily handled by typical micro controllers available today, which would have a clock frequency on the order of 13 MHZ and may take up to twenty clock cycles to take an action, or even longer if the controller needs to wake up.

The lock condition detector accordingly further includes a frequency detector 150 which includes a first divider 120 which divides the oscillator signal by a selected divisor N, and a second divider 130 which divides the reference signal by the same divisor N, and a second falling edge triggered DFF 140. Each divider receives at its clock input the respective oscillator or reference signal, counts the number of occurrences of the falling edge of the signal input thereto until the count reaches the selected divisor, and thereupon outputs an end of count signal (logic low). The end of count signal from the first divider 120, representing the divided oscillator signal, is supplied to the D input of the DFF 140 and the end of count signal from the second divider 130, representing the divided reference signal, is supplied to the CK input of the DFF 140. The end of count signal from the reference divider 130 is also used to reset the reference divider 130 and the oscillator divider 120. The divided reference signal is thus being used to sample the divided oscillator signal.

Figure 4:
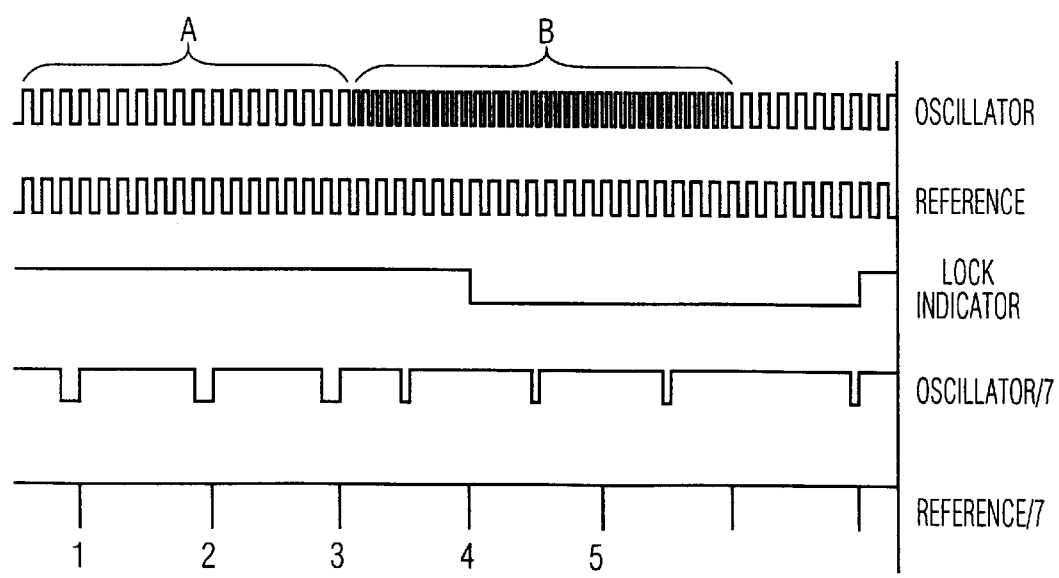
FIG. 4 is a timing diagram for the frequency detector portion of the circuit of FIG. 2.

FIG. 4 is a timing diagram illustrating the principles of operation of the frequency detector 150. In this Figure, a region "A" is shown in which the oscillator and reference signals are within the above specified lock condition and a region "B" where the oscillator and reference signals are out of lock. As shown in FIG. 4, the end of count output of reference divider 130 is logic high until N cycles are counted, at which point the output is logic low for a brief instant (due to gate delay), upon which both dividers 120 and 130 are reset. The DFF 140 is clocked on the end of count signal (logic low) from the divider 130, and outputs at its $\overline{Q}$ output the inverse of the value at its D input on the occurrence of the logic low. The DFF 140 essentially determines whether an end of count signal is reached by divider 120 within the time period between successive end of count signals of the divider 130. If the end of count signal for the oscillator signal occurs within one cycle of the end of count signal of the reference signal, the frequency error is less than 1/N, and the $\overline{Q}$ output of DFF 140 is logic high. Where N is seven, this means that the frequency error is less than ⅐, or 14%. This is illustrated with the first three cycles of the "reference/7" signal, wherein on its falling edge the logic value of the signal "oscillator/7" is logic low (making the $\overline{Q}$ output logic high). Conversely, as illustrated with cycles 4 and 5, the value of the divided oscillator signal is logic high, indicating the frequency difference is greater than 14% and making the $\overline{Q}$ output of DFF 140 logic low.

The output 111 of the phase detector and the output 151 of the frequency detector are then input to a logic device, in this case simply the AND gate 170. As discussed above, on a given clock cycle, the output 111 of the phase detector 110 will be logic high if the oscillator signal has a phase error of less than $\pi/2$ from the ideal phase difference of $\pi/2$ for the PLL with a Gilbert cell mixer. The output 151 of the frequency detector 151 will be logic high if the difference in frequency is less than 1/N. When both conditions are met, the output of the AND gate 170 is logic high, indicating that the oscillator signal is in lock with the reference signal. If either or both of the outputs are logic low, the output of the AND gate 170 is logic low, indicating that the oscillator signal is out of lock with the reference signal.

The reader will notice that the lock indication signal is at a much lower frequency than the frequency difference between the oscillator and reference signals in the out of lock region ("B") of the timing diagram. As previously discussed, if there is a large difference in frequency and the oscillator and reference signals are out of phase, the logic output of the DFF 115 will typically switch at very high frequencies and will be difficult to detect. The disclosed combination of the frequency detector 150 with the phase detector 100 solves this problem because whenever there is a large frequency error (greater than 1/N) the output of DFF 140 will remain logic low, as will the output of lock indicator 170. Thus, the frequency detector stabilizes the lock condition signal to an out of lock state when there is a large error in frequency. Additionally, the frequency detector ensures that an out of lock condition signal is produced when the phase detector might otherwise erroneously produce an in lock signal, in the case where the reference and oscillator signals are multiples of each other.

It will be clear from the foregoing that other variations can be made without departing from the principles described herein. For example, the divisor N is selected in dependence on the frequency of the input signals and the output frequency desired, as dictated by a particular application with respect to the PLL and device which must read the lock detector output signal. Other circuit devices may be used to carry out functions corresponding to those discussed herein. Additionally, other logic functions and inverse logic states may be used to simplify physical implementation of the detector. Accordingly, while the preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A lock condition detector for determining whether two signals are within a specified lock condition, said lock detector comprising:

a phase detector receiving the first and second signals and outputting a phase condition signal indicative of the first and second signals being within or outside of a prescribed phase difference;

a frequency detector receiving the first and second signals and outputting a frequency condition signal indicative of the first and second signals being within or outside of a prescribed frequency difference; and an analyzer receiving the phase condition signal and the frequency condition signal, said analyzer outputting a lock condition signal indicative of the first and second signals being out of lock whenever the phase condition signal indicates that the first and second signals are outside of the prescribed phase condition and whenever the frequency condition signal indicates that the first and second signals are outside of the prescribed frequency condition.

2. A lock condition detector according to claim 1, wherein said analyzer outputs a lock condition signal indicative of an un-lock condition only when the phase condition signal indicates the first and second signals are within the prescribed phase condition and the frequency condition signal indicates that the first and second signals are within the prescribed frequency condition.

3. A lock condition detector according to claim 2, wherein said phase detector is clocked by one of the first and second signals, and the phase condition signal, when the first and second signals are outside of the prescribed phase condition, is a bit stream of logic bits having a frequency proportional to the difference between the frequency of the first signal and the frequency of the second signal.

4. A lock condition detector according to claim 3, wherein said phase detector comprises a DFF having a data input and a clock input, each input receiving a respective different one of said first and second signals.

5. A lock condition detector according to claim 3, wherein said frequency detector comprises a first divider dividing the first signal by a selected divisor and outputting an end of count signal upon dividing the first signal by the selected divisor;

a second divider dividing the second signal by the selected divisor and outputting an end of count signal upon dividing by the selected divisor; and a DFF having a data input and a clock input, each input receiving a respective different one of the end of count signals from said first divider and said second divider.

6. A lock condition detector according to claim 1, wherein said phase detector comprises a DFF having a data input and a clock input, each input receiving a respective different one of said first and second signals.

7. A lock condition detector according to claim 1, wherein said frequency detector comprises a first divider dividing the first signal by a selected devisor and outputting an end of count signal upon dividing the first signal by the selected divisor;

a second divider dividing the second signal by the selected divisor and outputting an end of count signal upon dividing by the selected divisor; and a DFF having a data input and a clock input, each input receiving a respective different one of the end of count signals from said first divider and said second divider.

8. A circuit comprising:

a) a phase locked loop circuit including an oscillator having a control input, and an output outputting an oscillator signal;

a loop comparator having a first input for receiving a reference signal and a oscillator input coupled to receive the output of said oscillator, said comparator providing a control signal to the control input to control the output oscillator signal; and b) a lock condition detector comprising a phase detector receiving the reference and oscillator signals and outputting a phase condition signal indicative of the reference and oscillator signals being within or outside of a prescribed phase difference;

a frequency detector receiving the reference and oscillator signals and outputting a frequency condition signal indicative of the reference and oscillator signals being within or outside of a prescribed frequency difference; and an analyzer receiving the phase condition signal and the frequency condition signal, said analyzer outputting a lock condition signal indicative of the reference and oscillator signals being out of lock whenever the phase condition signal indicates that the reference and oscillator signals are outside of the phase condition and whenever the frequency condition signal indicates that the reference and oscillator signals are outside of the prescribed frequency condition.

9. A circuit according to claim 8, wherein said analyzer outputs a lock condition signal indicative of an in-lock condition only when the phase condition signal indicates the reference and oscillator signals are within the prescribed phase condition and the frequency condition signal indicates that the reference and oscillator signals are within the prescribed frequency condition.

10. A circuit according to claim 9, wherein said phase detector is clocked by one of the reference and oscillator signals, and the phase condition signal, when the reference and oscillator signals are outside of the prescribed phase condition, is a stream of logic bits having a frequency proportional to the difference between the frequency of the reference signal and the frequency of the oscillator signal.

11. A circuit according to claim 10, wherein said phase detector comprises a DFF having a data input and a clock input, each input receiving a respective different one of said reference and oscillator signals.

12. A circuit according to claim 10, wherein said phase detector of said phase locked loop comprises a Gilbert cell mixer, the reference and oscillator signals being nominally in lock with a phase difference of +/−π/2, and the phase detector outputting an in lock condition signal when the error from the nominal phase difference is less than +/−π/2.

13. A circuit according to claim 10, wherein said frequency detector comprises a reference divider dividing the reference signal by a selected divisor and outputting an end of count signal upon dividing the reference signal by the selected divisor;

an oscillator divider dividing the oscillator signal by the selected divisor and outputting an end of count signal upon dividing by the selected divisor; and a DFF having a data input and a clock input, each input receiving a respective different one of the end of count signals from said reference divider and said oscillator divider.

14. A circuit according to claim 8, wherein said phase detector comprises a DFF having a data input and a clock input, each input receiving a respective different one of said reference and oscillator signals.

15. A circuit according to claim 8, wherein said frequency detector comprises a reference divider dividing the reference signal by a selected devisor and outputting an end of count signal upon dividing the reference signal by the selected divisor;

an oscillator divider dividing the oscillator signal by the selected devisor and outputting an end of count signal upon dividing by the selected divisor; and a DFF having a data input and a clock input, each input receiving a respective different one of the end of count signals from said reference divider and said oscillator divider.

16. A circuit according to claim 8, wherein said phase detector of said phase locked loop comprises a Gilbert cell mixer, the reference and oscillator signals being nominally in lock with a phase difference of +/−π/2, and the phase detector outputting an in lock condition signal when the error from the nominal phase difference is less than +/−π/2.

17. A method of detecting whether first and second signals are within a lock condition of each other, said method comprising:

detecting whether the first and second signals are within or outside a prescribed phase condition;

detecting whether the first and second signals are within a prescribed frequency condition; and indicating an out of lock condition of the first and second signals whenever the first and second signals are outside of the prescribed phase condition and whenever the first and second signals are outside of the prescribed frequency condition.

18. A method according to claim 17, further comprising indicating ha an in lock condition only when the first and second signals are within the prescribed phase condition and within the prescribed frequency condition.

* * * * *